United States Patent [19]

Rowe et al.

[11] 4,447,512

[45] May 8, 1984

[54] METHOD FOR MAKING A NEGATIVE WORKING LITHOGRAPHIC PRINTING PLATE

[75] Inventors: William Rowe, Westfield, N.J.; Eugene Golda, Monsey; Alan Wilkes, Brewster, both of N.Y.

[73] Assignee: Polychrome Corporation, Yonkers, N.Y.

[21] Appl. No.: 342,333

[22] Filed: Jan. 25, 1982

[51] Int. Cl.$^3$ .................. G03C 1/71; G03C 1/54; G03F 7/08

[52] U.S. Cl. ........................ 430/17; 204/159.14; 430/176; 430/280; 430/905; 430/910

[58] Field of Search ............. 430/176, 280, 905, 910, 430/17; 204/159.14

[56] References Cited

U.S. PATENT DOCUMENTS 4,171,974 10/1979 Golda et al. ............... 430/280
4,237,216 12/1980 Skarvinko .................. 430/280
4,390,615 6/1983 Courtney et al. ............ 430/280

Primary Examiner—Richard L. Schilling

[57] ABSTRACT

An O-epoxyalklyated tetrakis (hydroxyphenyl) alkane resin or the esterified reaction product of about one equivalent thereof with less than one equivalent of an ethylentically unsaturated organic acid can be combined with an aqueous alkali- and radiation sensitive, negative acting substance which when coated on a substrate forms a radiation sensitive negative working element.

18 Claims, No Drawings

4,447,512

METHOD FOR MAKING A NEGATIVE WORKING LITHOGRAPHIC PRINTING PLATE

BACKGROUND OF THE INVENTION

This invention relates to negative-acting, radiation-sensitive compositions. More particularly, it relates to negative-acting, radiation-sensitive compositions which can be used in the preparation of imageable elements useful in preparing negative-working lithographic plates, as well as such elements and the lithographic plates prepared therefrom.

The art of lithographic printing depends upon the immiscibility of grease and water, upon the preferential retention of a greasy image-forming substance by an image area, and upon the similar retention of an aqueous dampening fluid by a non-image area. When a greasy image is imprinted upon a suitable surface and the entire surface is then moistened with an aqueous solution, the image area will repel the water and the non-image area will retain the water. Upon subsequent application of greasy ink, the image portion retains the ink whereas the moistened non-image area repels it. The ink on the image area is then transferred to the surface of a material on which the image is to be reproduced, such as paper, cloth and the like, via an intermediary, so-called offset or blanket cylinder, which is necessary to prevent mirror-image printing.

The type of lithographic printing plate to which the present invention is directed is prepared from an imageable element comprising a lithographically suitable support material having aherent to at least one surface thereof a coating comprising a radiation-sensitive composition. Said element is referred to as "presensitized" or "wipe-on" plates depending upon whether the coating is applied to the base material by the manufacturer or by the lithographer, respectively. Depending upon the nature of the radiation-sensitive coating employed, the treated element may be utilized to reproduce directly the image to which it is exposed, in which case it is termed a positive-acting printing plate, or to produce an image complementary to the one to which it is exposed, in which case it is termed a negative-acting printing plate. In either case, the image area of the developed printing plate is oleophilic and the non-image area is hydrophilic.

In the case of a negative-working element which is exposed to radiation through a negative transparency, the radiation-sensitive material, commonly a diazonium compound, is caused to harden and thereby become insoluble in a desensitizing, (i.e., decoating) composition applied to the element, after radiation exposure, for the purpose of removing that part of the radiation-sensitive coating which, because it was protected from the radiation by the negative, was not radiation hardened. The hardened surface of a negative-acting printing plate will be the oleophilic surface compatible with the greasy ink and is called the "image area". The surface from which the non-hardened radiation-sensitive material has been removed by the desensitizer will be, or can be converted to, a hydrophilic surface having little affinity for the greasy ink and is called the "non-image" area.

In U.S. Pat. No. 4,171,974 there are described negative-acting, radiation-sensitive compositions comprising a negative working lithographic photosensitizer and diacrylated (wherein acrylated refers to either acrylic or methacrylic acid esters) bisphenol-A based epoxy resins. U.S. Pat. No. 4,174,307 describes a similar radiation-sensitive composition which are based on diacrylated oligourethanes. Australian Pat. No. 439,241 also describes radiation-sensitive compositions comprising acrylic and methacrylic esters of diepoxy compounds derived from bisphenols and phenol-formaldehyde novolaks of unsaturated functionality up to 3.3.

The above compositions suffer, due to their low unsaturation levels, from, inter alia, short shelf lives and relatively low radiation-sensitivity while lithographic plates prepared from imageable elements comprising said compositions are subject to the disadvantages, inter alia, of poor contrast between image and non-image areas, peeling of the image areas from the base materials, and short press runs.

It has now been found, in accordance with this invention, that negative-acting radiation-sensitive elements may be prepared having long shelf lives and high radiation-sensitivity which are sueful in the preparation of lithographic printing plates of high contrast between image and non-image areas thereof, high adhesion of the image areas to the support materials and long press runs. It has also been found, in accordance with specific embodiments of the invention, that compositions may be prepared which are aqueous-alkali decoatable and/or in the image areas have increased oleophilicity.

SUMMARY OF THE INVENTION

It is an object of this invention to provide a negative-working, radiation-sensitive composition of high shelf life and radiation-sensitivity.

It is another object of this invention to provide the above composition additionally having aqueous-alkali-sensitivity and/or high oleophilicity.

It is yet another object to provide an imageable, element of high radiation-sensitivity and shelf life which may, optionally, also be aqueous-alkali developable and/or have high oleophilicity.

Another object of this invention is to provide a negative-working lithographic printing plate of long press life, good adhesion between the base material and image, and optionally, increased oleophilicity in the image areas.

These and other objects of the instant invention will be in part discussed and in part apparent upon consideration of the detailed description of the preferred embodiment.

DETAILED DESCRIPTION OF THE INVENTION

In accordance with this invention there is provided a radiation-sensitive, negative-working composition, of long pot life, useful in the preparation of imageable elements of long shelf life and exposure speed and lithographic printing plates of long press runs and good contrast.

Thus, in accordance with this invention there is provided a radiation-sensitive, negative-acting resin, of polymerization functionality greater than two, which is an O-epoxyalkylated tetrakis (hydroxyphenyl) alkane resin or an ester thereof which is the product of one equivalent of the O-epoxyalkylated resin, with less than one equivalent of an organic acid wherein said organic acid comprises at least one substituted or unsubstituted ethylenically mono- or polyunsaturated acid.

The tetrakis alkane resin is preferably of the formula

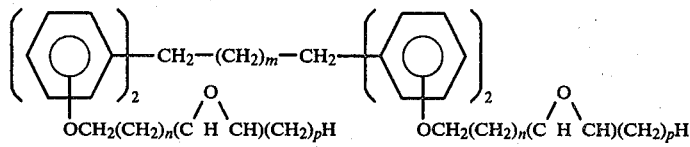

wherein m is an integer of 0–10, preferably 0–2, and n and p are integers whose sum is 0–10, preferably 0–2. Most preferably, m, n and p are 0. Such resins can exist in dimerized or trimerized form or as various mixtures thereof. One example of such an O-epoxyalkylated resin is 1,1,2,2-tetrakis [(2,3-epoxypropoxy)phenyl] ethane, a commercially available resin sold under the trademark Epon 1031 which has an epoxy equivalent of 210.240 and a Gardner-Holdt viscosity at 25° C. of $Z_4$–$Z_8$.

Ethylenically unsaturated acids useful in preparing the resins of the instant invention include carboxylic acids, such as, acrylic, methacrylic, cinnamic, crotonic, oleic, linoleic, and linoleic, and the like; sulfonic acids, and phosphonic acids, and mixtures thereof.

The above esterified resins, due to the large number of hydroxyl groups which they contain, are relatively hydrophilic. This can result in undesirable effects when using lithographic printing plates derived therefrom due to decreased contrast between the image and non-image areas of said plates caused by increased water pickup in the image areas. Consequently, it has been found advantageous to increase the oleophilicity of said image areas.

Therefore, in accordance with another embodiment of this invention there is provided a radiation-sensitive, negative-working composition of increased oleophilicity which is prepared by reacting the above O-epoxyalkylated phenolic resin with the unsaturated acid, as described above and, either concurrently or subsequently, with long chain saturated acids such as, carboxylic acids, e.g., pelargonic, palmitic, stearic, and the like; sulfonic acids, e.g., decane, hexadecane and the like; and phosphic acids, e.g., octadecane, nonane, and the like and mixtures thereof.

In view of the current environmental pressures to prepare materials and use processes which are not harmful to the environment the graphic industry, as others, has been searching for materials and processes based on aqueous systems to reduce the dependence on ecologically undesirable materials such as, organic solvents. The above resins, while having many properties which are improvements over the prior art, are dependent upon organic solvent systems for development of the imagewise exposed plates.

It has now been found, in accordance with the invention, that radiation-sensitive, negative-working compositions may be prepared which are, inter alia, aqueous-alkali sensitive (i.e., imagewise exposed elements derived therefrom may be developed by means of aqueous alkaline developers).

Thus, in accordance with this embodiment of the invention, there is provided a radiation- and aqueous alkali-sensitive, negative-working composition comprising the admixtures of, A. the radiation-polymerizable compound which is the O-epoxyalkylated phenolic resin or ester product of the reaction of about one equivalent thereof with less than one equivalent of an organic acid; and B. at least one radiation- and aqueous alkali-sensitive component.

If desired, in order to enchance oleophilicity of the image areas of the printing plates derived from the above composition, the organic acid above may further comprise a saturated organic acid as described above, which may have been reacted with said epoxylated resin concurrently with, or subsequent to, the unsaturated acid.

Radiation-and aqueous alkali-sensitive components are well known in the art and include monomeric and polymeric diazonium compounds such as the reaction product of para-diazodiphenylamine with paraformaldehyde, the azidopyrenes, for example, 1-azidopyrene, 6-nitro-1-azidopyrene, 1,6-diazidopyrene, 1,8-diazopyrene, 1-propionyl-6-azidopyrene, 1-acetyl-6-azidopyrene, 1-n-butyryl-6azidopyrene, 1-n-propionyl-8-bromo-6-azidopyrene; and 8-n-propionyl-1,6-diazidopyrene; 4-diazodiphenylamine sulfate; 1-diazo-4-N,N-dimethylaminobenzene, zinc chloride; 1-diazo-4-N,N-diethylaminobenzene, zinc chloride; 1-diazo-(4-N-ethyl-N-hydroxyethyl)aminobenzene, ½ zinc chloride; 1-diazo-(4-N-methyl-N-hydroxyethyl)aminobenzene, ½ zinc chloride; 1-diazo-2,5-diethoxy-(4-benzoylamino)-benzene, ½ zinc chloride; 1-diazo-4-N-benzylaminobenzene, ½ zinc chloride; 1-diazo-4-N,N-dimethylaminobenzene borofluoride; 1-diazo-4-morpholinobenzene, ½ zinc chloride; 1-diazo-4-morpholinobenzene borofluoride; 1-diazo-2,5-dimethoxy-4-(p-tolylmercapto)benzene, ½ zinc chloride; 1-diazo-2-ethoxy-4-N,N-dimethylaminobenzene, ½ zinc chloride; 4-diazo-N,N-dimethylaniline, ½ zinc chloride; 1-diazo-4-(N,N-diethylamino)benzene, ½ zinc chloride; 1-diazo-2,5-dibutoxy-4-morpholinobenzene sulfate; 1-diazo-2,5-diethoxy-4-morpholinobenzene, ½ zinc chloride; 1-diazo-2,5-dimethoxy-4-morpholinobenzene, zinc chloride; 1-diazo-2,5-diethoxy-4-morpholinobenzene borofluoride; 2-diazo-1-naphthol-5-sulfonic acid, sodium salt; 1-diazo-4-N,N-diethylamino benzene borofluoride; 1-diazo-2,5-diethoxy-4-p-tolylmercaptobenzene, ½ zinc chloride; 1-diazo-3-ethoxy-4-(N-methyl-N-benzylaminobenzene ½ zinc chloride; 1-diazo-3-chloro-4-(N,N-diethylamino)benzene, ½ zinc chloride; 1-diazo-3-methyl-4-pyrrolidinobenzene chloride, zinc chloride; 1-diazo-3-methyl-4-pyrrolidinobenzene borofluoride; 1-diazo-2-chloro-4-(N,N-dimethylamino)-5-methoxybenzene borofluoride; 1-diazo-3-methoxy-4-pyrrolidinobenzene, zinc chloride; and the condensation product of 4-diazo-diphenylamine sulfate with formaldehyde and zinc chloride as well as the negative-working diazo compositions listed on pages 201–214 of *Light-Sensitive Systems*, by Jaromir Kosar, John Wiley and Sons, New York 1965.

A prererred diazonium compound for use in connection with this invention is the product of the reaction of (A) 2-ethoxy-4-methoxybenzophenone-5-sulfonic acid with (B) the product of the condensation of p-diazodiphenylamine with formaldehyde.

The esterified resins according to the invention are prepared by methods well known in the art, e.g., by heating a solution comprising the organic acids, the O-epoxyalkylated phenolic resins and a proper solvent in the presence of an acidic catalyst.

Solvents useful in the preparation of the composition according to the invention are well known in the art. Preferred solvents are ethyleneglycol monomethyl ether and its acetate, ethyl acetate, and mixtures thereof.

The acid catalysts which may be employed in accordance with the invention include mineral acids, such as HCl and $H_2SO_4$; organic acids, i.e., aryl and alkyl carboxylic, such as benzoic and acetic; sulfonic such as p-toluenesulfonic; phosphonic acids; and preferably Lewis acids such as $SnCl_2$, $AlCl_3$ and $BF_3$ which may be employed in their free or complexed forms. A preferred acid according to the invention is $SnCl_2.2H_2O$.

The amounts of reactants are so chosen that the final products should have a carboxyl/epoxide ratio of 0.5 to 1, preferably about 0.7 to about 0.8 and most preferably about 0.8. The carboxyl/epoxide ratio, which is an average value, is defined as the number of ester groups present in the final product divided by the epoxide equivalent of the originally present O-epoxyalkylated resin. It is further desirable that the reaction mixture and final solution comprising the invention composition comprise approximately 50% N.V. (N.V.=non-volatile or solids).

The reaction mixture will also usually contain an inhibitor of thermal polymerization (which are well known in the art) to prevent polymerization of the reactants and/or products during preparation of the composition. Preferred inhibitors are hydroquinone monomethyl ether (MEHQ), benzyl-dimethylamine (BDMA) and mixtures thereof.

The reaction is run for a period of time (about 10 to 26 hours) until the desired viscosity and acid value, i.e., the amount of free acid present in the reaction mixture. It is desirable that the acid value be 1 or less.

If desired, the compositions according to the invention may also contain additives such as other resins, reactive diluents, radiation-sensitive-polymerization initiators and sensitizers, thermal polymerization initiators and inhibitors and colorants. The number and type of additives used will depend upon the end use to which the composition is to be put.

Thus, dependent upon the type of radiation to be used in the imaging processes, the composition would also contain, e.g., thermal initiators for exposure to thermal energy sources, photosensitive initiators for exposure to radiation sources, e.g., UV, or no initiators at all for exposure to electron beam sources. The types of radiation to which the compositions of the instant invention may be sensitive include UV, IR and visible light, radiowaves, sound waves, electron beam, microwaves and the like. If desired, the composition may be subjected to one or more forms of radiation and, therefore, the composition may contain several types of initiators.

Radiation-sensitive initiators and sensitizers are well known in the art and include peroxides such as benzoyl, hydroperoxides; cumene, azonitriles, e.g., azobis- (isobutyronitrile); diazonium compounds; and the like and mixtures thereof.

The other resins which are useful in the composition according to this invention are known in the art and may be reactive or unreactive. Illustrative of such resins are, epoxy resins, poly(vinyl acetals), polyurethanes, poly(vinyl formals), and the like and mixtures thereof.

In accordance with another embodiment of the invention there is provided a radiation-sensitive element comprising a support upon at least one surface of which there has been applied any of the above radiation compositions according to the invention.

Supporting materials useful in the invention are known in the art and their choice depends upon the final use of the element. Such supporting materials include aluminum and its alloys, metal foil laminates with plastic or paper, silicon and the like.

In yet another embodiment of the invention there is provided a lithographic printing plate prepared by imagewise exposing any of the above elements according to the invention, wherein the supporting material is lithographically suitable, to radiation through a transparency, developing the thus exposed element with an aqueous alkali developer to remove unexposed areas thereof. If desired, the developed plate may also be post treated by heating or overall exposure to radiation.

The following examples are non-limiting illustrations of the invention.

EXAMPLE 1

Preparation of esterified resin

|  | gms. |
|---|---|
| A solution of, a glycidylated phenolic resin (Epon TM 1031, Shell Chemical Co.) | 240.0 (1.116 epoxide equivalents) |
| hydroquinone monomethyl ether (MEHQ) | 0.155 |
| $SnCl_2.2H_2O$ | 0.86 |
| benzyldimethylamine (BDMA) | 1.71 |
| and ethyl acetate | 94.4 | was heated to reflux. To the above solution, at reflux, there was added a mixture consisting of 55.0 gms. of glacial acrylic acid ("AA"-0.764 eq) and 17.4 gms. of pelargonic acid ("PA"-0.109 eq). The addition was completed in about 1 hour. The reaction mixture was then maintained at reflux until the acid value (A.V.) fell to less than 0.5 (approximately 10 hours). After cooling, the concentration of the reaction mixture was reduced, by addition of ethylene glycol monomethyl ether (EGME), to an approximate 50% wt. non-volatiles (N.V.) content. The solution had a viscosity (GH 1933 Std) of 200 centistokes (cs) at 50.6% wt. N.V., all viscosities being based on the Gardner-Holt 1933 standard. The carboxyl to epoxide ratio was about 0.782/1.0.

EXAMPLES 2-4

Preparation of esterified resins

Following the procedure of Example 1, three resins were prepared. The reactants and reaction parameters are given in the following Table.

| Example | Temp. °F. (°C.) | Acid (# of equiv.) | Glycidylated resin, wt. (epoxide equiv.) | $SnCl_2$ $2 H_2O$ gms. | MEHQ gms. | BDMA gms. | Solvent* gms. |
|---|---|---|---|---|---|---|---|
| 2 | Reflux | AA (0.877) | Epon 1031 | 0.985 | 0.18 | 1.97 | MCA |

-continued

| | | | REACTION MIXTURE | | | | |
|---|---|---|---|---|---|---|---|
| Example | Temp. °F. (°C.) | Acid (# of equiv.) | Glycidylated resin, wt. (epoxide equiv.) | SnCl$_2$ 2 H$_2$O gms. | MEHQ gms. | BDMA gms. | Solvent* gms. |
| 3 | 200 (93.5) | PA (0.225) AA (5.868) | 275 gms (1.28) Epon 1031 1566 gms (6.96) | 7.0 | 1.0 | 14.0 | 361.2 EGME acetate |
| 4 | 200 (93.5) | AA (1.41) PA (0.20) | Epon 1031 5186 gms (2.3) | 1.82 | 0.33 | 3.61 | EGME 657 |

*MCA = Methyl Cellosolve ™ acetate; Sufficient for charge to contain 50% N.V. for MCA and 40% N.V. in EGME and EGME acetate.

| | FINAL PRODUCT | | | |
|---|---|---|---|---|
| Example | Reaction Time Hrs. | Viscosity (cs) | Acid Value | Carboxyl Epoxy Ratio |
| 2 | 13 | 95 | 1.0 | 0.818 |
| 3 | 11 | 100 | 0.37 | 0.84 |
| 4 | 10 | 65 | 0.2 | 0.7 |

EXAMPLE 5

Preparation of radiation-sensitive element

I. Preparation of substrate

A sheet of AA ™ 3003 aluminum was degreased using a 4% wt. aqueous NaOH solution and then mechanically grained to a surface roughness (Ra) value of 0.4. The sheet was then anodized in an 18% wt. aqueous H$_2$SO$_4$ solution, at 25° C., and 25 amp/ft.$^2$ for one minute. The anodized sheet was subsequently rinsed with water for 20 seconds and immersed in a 3% wt. aqueous sodium silicate solution for 30 seconds at 70° C., followed by rinsing with deionized water.

II. Coating of Substrate (a) A radiation-sensitive composition admixture of

| | Parts By Weight |
|---|---|
| (1) The product of the reaction of | 1 |
| (i) 2-ethoxy-4-methoxybenzophenone-5-sulfonic acid with, | |
| (ii) the product of the condensation of p-diazodiphenylamine with formaldehyde. | |
| (2) DV ™ 521 (polyester manufactured by Polychrome) | 0.5 |
| (3) the product from Example 1 | 0.5 |
| (4) Orasol ™ Blue GN (a dye) | 0.1 |
| (5) Methyl orange | 0.02 |
| (6) Ethylene dichloride | 55 |
| (7) Methanol | 22 |
| (8) Methyl Cellosolve ™ | 18 |
| (9) N,N—Dimethylformamide | 2.88 | was applied to an aluminum sheet, prepared as in Part I, and dried.

(b) The procedure of part (a) was repeated with the exception that the resin from Example 1 was replaced by an equal amount of Epon ™ 1031, i.e., the non-esterified O-epoxyalkylated phenolic resin.

III. The elements of part II was subjected to accelerated shelf-life tests, and after exposure and development using an aqueous alkaline developer admixture of:

| | Parts By Weight |
|---|---|
| Water | 68 |
| n-propylalcohol | 22 |
| sodium lauryl sulfate | 5 |
| lithium benzoate | 2 |

-continued

| | Parts By Weight |
|---|---|
| benzyl alcohol | 3 | the resultant lithographic printing plates were subjected to press life runs. The following results were obtained:

| Elements from Part II | Accelerated shelf-life at 60° C. of element | Press-life Printing Plate (in good copies) |
|---|---|---|
| (a) | 8 days* | 110,000 |
| (b) | 6 days | 98,000 |

*Note:
One day at 60° C. is comparable to 6 months at room temperature

EXAMPLE 6–8

Following the procedures of Example 5, parts I and II, radiation sensitive elements are prepared substituting the products of Examples 2–4 for the product of Example 1.

Various changes and modifications can be made in the resins and elements and their preparation without departing from the spirit and scope of this invention. Throughout this specification and claims, all parts and percentages are by weight and all temperatures in degrees Celsius unless otherwise indicated.

What is claimed is:

1. A radiation sensitive, negative acting composition comprising (1) an aqueous alkali- and radiation sensitive, negative acting diazonium compound and (2) an O-epoxyalkylated tetrakis (hydroxyphenyl) alkane resin or the esterified reaction product of about one equivalent thereof with less than one equivalent of an ethylenically unsaturated organic acid.

2. The composition of claim 1 wherein said esterified reaction product further comprises a saturated organic acid.

3. The composition according to claim 2 wherein the unsaturated and saturated organic acids each contain from 3 to about 24 carbon atoms.

4. The composition according to claim 3 wherein each of said acids is selected from the group consisting of carboxylic, sulfonic and phosphonic acids.

5. The composition according to claim 4 wherein each of said acids is a carboxylic acid.

6. The composition according to claim 5 wherein said unsaturated acid is selected from the group consisting of acrylic, methacrylic, cinnamic, crotonic and itaconic acids.

7. The composition according to claim 6 wherein said unsaturated acid is acrylic acid.

8. The composition according to claim 6 wherein said unsaturated acid is methacrylic acid.

9. The composition according to claim 5 wherein said saturated acid is selected from the group consisting of fatty acids containing from about 6 to about 24 carbon atoms.

10. The composition according to claim 9 wherein said acid is pelargonic acid.

11. The composition according to claim 1 wherein said O-epoxyalkylated resin has the formula

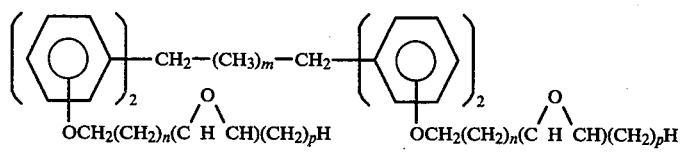

wherein m is an integer of 0–10 and n and p are integers whose sum is 0–10.

12. The composition according to claim 11 wherein m is 0–2 and the sum of n an p is 0–2.

13. The composition according to claim 12 wherein m, n and p are 0.

14. The composition according to claim 13 wherein said reaction product comprises about 0.5 to about 0.8 equivalents of said unsaturated acid.

15. The composition according to claim 14 wherein said reaction product comprises about 0.7 to about 0.8 equivalents of said unsaturated acid.

16. The composition according to claim 15 wherein said reaction product further comprises about 0.3 to about 0.1 equivalents of a saturated organic acid.

17. A radiation-sensitive, negative-working, element comprising a substrate having coated on at least one surface thereof a radiation-sensitive, composition according to claim 1 or claim 2.

18. A lithographic printing plate comprising an element according to claim 17 wherein the substrate comprises a lithographically suitable support material which has been imagewise exposed and developed.

* * * * *